United States Patent [19]

Otsuki et al.

[11] Patent Number: 4,712,023
[45] Date of Patent: Dec. 8, 1987

[54] BUFFERED FET LOGIC GATE USING DEPLETION-MODE MESFET'S.

[75] Inventors: Tatsuo Otsuki, Takatsuki; Akio Shimano, Osaka; Hiromitsu Aoki; Ikuko Aoki, both of Takatsuki, all of Japan

[73] Assignee: Matsushita Electric Industrial Co., Ltd., Kadoma, Japan

[21] Appl. No.: 929,844

[22] Filed: Nov. 13, 1986

[30] Foreign Application Priority Data

Nov. 13, 1985 [JP] Japan ................. 60-254124

[51] Int. Cl.$^4$ ................ H03K 19/017; H03K 19/094
[52] U.S. Cl. .................... 307/450; 307/448; 307/443; 307/475
[58] Field of Search ............... 307/443, 446, 450, 448, 307/475, 264, 270, 570, 581, 304

[56] References Cited

U.S. PATENT DOCUMENTS

| 4,177,390 | 12/1979 | Cappon | 307/450 |
| 4,423,339 | 12/1983 | Seelbach et al. | 307/475 |
| 4,450,369 | 5/1984 | Schuermeyer | 307/475 |

FOREIGN PATENT DOCUMENTS

| 0110701 | 6/1984 | European Pat. Off. | 307/475 |
| 0148365 | 11/1979 | Japan | 307/475 |
| 0019321 | 1/1985 | Japan | 307/448 |

OTHER PUBLICATIONS

Deming et al., "GaAs Configurable Cell Array Using BFL", IEEE JSSC, vol. SC-19, No. 5, Oct. 1984, pp. 728-737.
Livingstone et al., "Capacitor Coupling GaAs FET's", IEE Proc, Vol. 127, Pt. I, No. 5, Oct. 1980, pp. 297-300.
"Design and Fabrication of Depletion GaAs LSI High-Speed 32-Bit Adder", Yamamoto et al, IEEE Journal of Solid-State Circuits, vol. SC-18, No. 5, Oct. 1983.

Primary Examiner—Stanley D. Miller
Assistant Examiner—Timothy P. Callahan
Attorney, Agent, or Firm—Cushman, Darby & Cushman

[57] ABSTRACT

A buffered FET logic gate circuit has a bias diode (9), which is connected across the gate and the source of a current source FET (4) of a buffer part (3, 4), and a capacitor (8), which is connected across the gate of said FET (4) and an input terminal ($V_I$); and thereby a high load drivability with a low power consumption rate is realized.

18 Claims, 6 Drawing Figures

BUFFERED FET LOGIC GATE USING DEPLETION-MODE MESFET'S.

FIELD OF THE INVENTION AND RELATED ART STATEMENT

1. Field of the Invention

The present invention relates generaly to a gate circuit which is to be used in an integrated circuit. More particularly the present invention relates to an improvement in a buffered FET logic (BFL).

2. Description of the Related Art

FIG. 1 shows a circuit diagram of a conventional gate circuit which is generally to as BFL (Buffered FET Logic) in an integrated circuit. The conventional circuit comprises a series connection of a depletion type switching FET 1 and a depletion type load FET 2 and another series connection of a depletion type buffer FET 3, a level shift diode 5 and a depletion type current source FET 4 for supplying a constant current to the buffer FET 3. A first power source terminal 6 and a second power source terminal 7 are connected to the sources of the depletion type switching FET 1 and the depletion type current source FET 4, respectively. The gate of the depletion type load FET 2 is connected to its source. An input terminal $V_I$ is connected to the gate of the depletion type switching FET 1, and output terminal $V_O$ is connected to the junction point between the level shift diode 5 and the drain of the depletion type current source The operation of the above-mentioned conventional BFL is as follows: When an input signal is given through the input terminal $V_I$ to the gate of the switching FET 1, an inversed signal is given to the gate of the buffer FET 3. Since the sizes of the current source FET 4 and the buffer FET 3 are designed to be equivalent, gate-source voltage of the buffer FET 3 is substantially zero volt; in other words, source potential and gate potential of the buffer FET 3 are substantially equally each other. Then, the potential is converted by the level shift diode 5 to such a level as to enable switching of the next stage switching FET, and output of such level is issued through the output terminal $V_O$.

The BFL of the above-mentioned conventional configuration has such a problem that, power consumption in the BFL is considerably large, since substantially a constant current always flows in the buffer circuit constituted by the buffer FET 3, the level shift diode 5 and the current source FET 4. On the other hand, ability to drive the subsequent load lowers when current is decreased to reduce the power consumption in the BFL.

OBJECT AND SUMMARY OF THE INVENTION

The object of the present invention is to provide a gate circuit capable of making an ultra high speed operation.

Another object of the present invention is to provide a gate circuit which has extremely high load drive ability with reasonably low power consumption.

These and other objects are accomplished by a gate circuit which comprises;
- a first power source terminal to be supplied with a first potential,
- a second power source terminal to be supplied with a second potential,
- a third power source terminal to be supplied with a third potential,
- a first FET connected by its gate to an input terminal and by its source to the first power source terminal,
- a second FET connected by its gate and source to the drain of the first FET and by its drain to the third power source terminal.
- a third FET connected by its gate to the drain of the first FET and the source and the gate of the second FET and by its drain to the third power source terminal,
- a first diode connected by its one electrode to the source of the third FET,
- a fourth FET connected by its drain to the other electrode of the first diode and by its source to the second power source terminal,
- an output terminal connected to junction point between the other electrode of the first diode and the drain of the fourth FET,
- a second diode connected by its one electrode to the source of the fourth FET and by its other electrode to the gate of the fourth FET, and
- a capacitive element connected across a junction point between the gate of the fourth FET and the other electrode of the second diode and the gate of the first FET.

In the embodiments, the FETs are FET of MES structure. Furthermore, in the embodiments the capacitive element is constituted preferably by MIM (Metal-Insulator-Metal) type element and or junction capacitance of diode.

This invention has various advantages, among which are as follows.

(1) A super high speed operation is possible.
(2) Stability to drive load is very high.
(3) The gate circuit is of low power consumption.

While the novel features of the invention are set fourth with particularity in the appended claims, the invention, both as to organization and content, will be better understood and appreciated, along with other objects and features thereof, from the following detailed description taken in conjunction with the drawings.

DESCRIPTION OF THE PREFERRED EMBODIMENT

Figure 1:
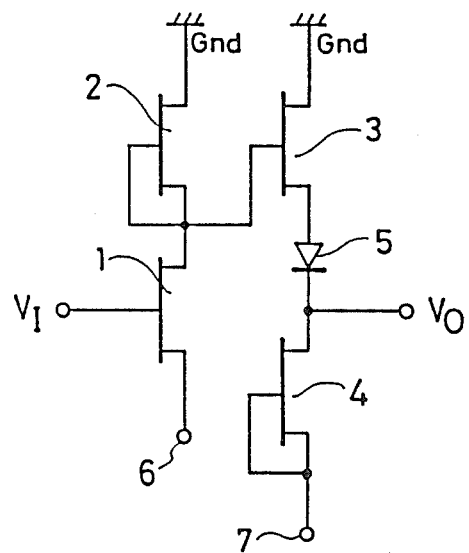
FIG. 1 is the circuit diagram of the conventional gate circuit.
Figure 2:
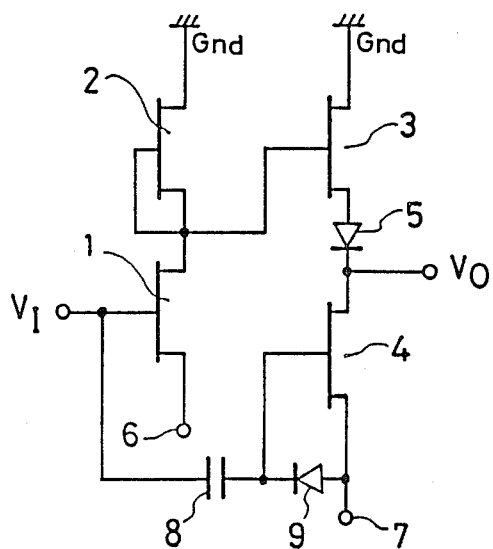
FIG. 2 is a circuit diagram of a gate circuit of a first embodiment in accordance with the present invention.

Hereafter, preferred embodiments of the present invention is described with reference to the accompanying drawings. FIG. 2 shows a circuit diagram of a gate circuit on a GaAs IC which is a first embodiment of the invention. In FIG. 2, which shows a circuit diagram of an embodiment gate circuit. The embodiment circuit comprises a series connection of a depletion type switching FET 1 and a depletion type load FET 2 and another series connection of a depletion type buffer FET 3, a level shift diode 5 and a depletion type current source FET 4 for supplying a constant to the buffer FET 3. A first power source terminal 6 and a second power source terminal 7 are connected to the sources of the depletion type switching FET 1 and the depletion type current source FET 4, respectively. The gate of the depletion type load FET 2 is connected to its source. An input terminal $V_I$ is connected to the gate of the depletion type switching FET 1, and also to the gate of the current source FET 4 through a coupling capacitor or capacitive element 8. The gate of the current source FET 4 is connected to its source through a diode 9. Output terminal $V_O$ is connected to the junction point between the level shift diode 5 and the drain of the depletion type current source FET 4.

The operation of the above-mentioned embodiment gate circuit is as follows: When an input signal is given through the input terminal $V_I$ to the gate of the switching FET 1, an inversed signal is given to the gate of the buffer FET 3. Since the sizes of the current source FET 4 and the buffer FET 3 are designed to be equivalent, gate-source voltage of the buffer FET 3 is substantially zero volt. In other words, source potential and gate potential of the buffer FET 3 are substantially equally each other. Then the potential is converted by the level shift diode 5 to such a level as to enable switching of the next stage switching FET, and output of such level is issued through the output terminal $V_O$.

On the other hand, the input signal given at the input terminal $V_I$ is given to the gate of the current source FET 4 through the coupling capacitor 8, since the gate of the current source MESFET is biased to the potential of the second power source 7, and the capacitor 8 is connected between the input terminal $V_I$ and the gate of the current source MESFET 4. The input signal is given from the input terminal $V_I$ to the gate of the MESFET 4 being biased to the potential of the second power source 7 by means of the diode 9. As a result of this function, when the input potential transfers to the low level a potential which is below the potential of the second power source 7 is impressed. And thereby the MESFET 4 becomes a pinch-off state. Accordingly, the current flowing in the MESFET 4 becomes as shown in FIG. 3(b). That is, the current of the MESFET 4 decreases to substantially zero, at the time $t_1$ of the transfer to low level of the input. As a result, a very large current flows in the capacitive load which is connected to the output terminal $V_O$ from the ground terminal Gnd, and thereby, a capacitive load can be charged within a very short time.

Figure 3:
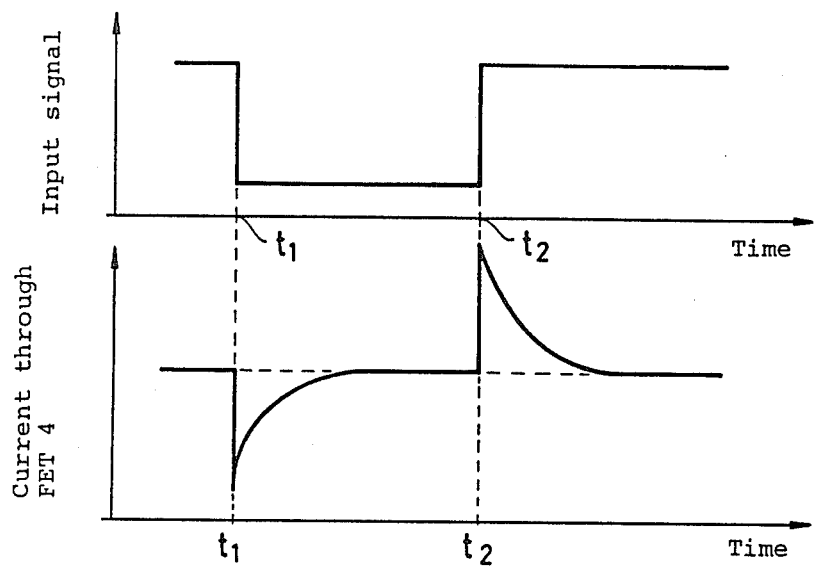
FIG. 3 is a graph showing manner of change of current flowing in the current source FET 4 in relation to change of input signal to the input terminal $V_I$.

When the input signal turns to high level at a time $t_2$, the gate of the MESFET 4 is impressed with a high voltage from the second power source 7, and therefore a current flowing through the MESFET 4 rapidly increases at the time $t_2$ as shown in FIG. 3. Therefore, discharging of the capacitive load can be made within a short time.

That is, by means of the configuration of FIG. 2, ability of driving the load is drastically increased without any increase of average power consumption.

Figure 4:
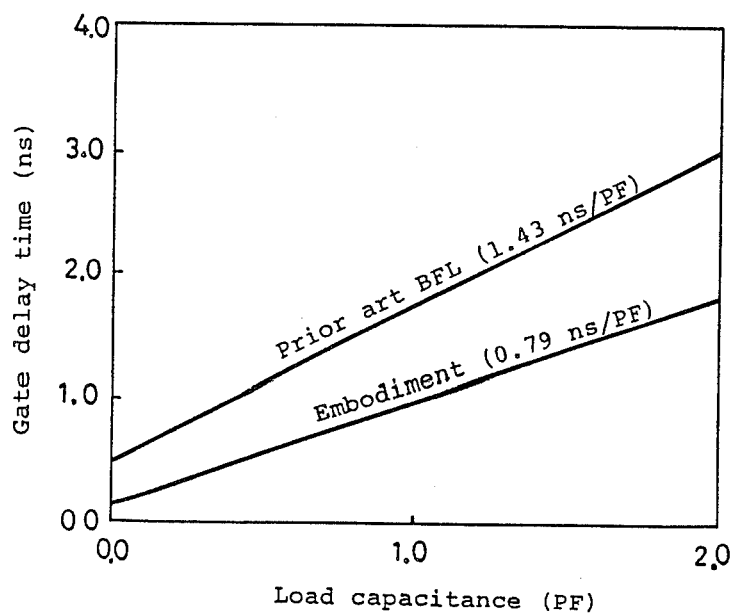
FIG. 4 is a graph showing relation between gate delay time and loaded capacitance which shows load drivability.

FIG. 4 shows characteristic of the gate delay time for capacitive load in the conventional BFL circuit and in the gate circuit of the present embodiment. As shown in this graph, the gate circuit of this embodiment has a load driving ability of as large as about 2 times of the conventional BFL circuit.

As an important characteristics of the configuration of the circuit of this embodiment, the sizes of the coupling capacitor 8 and the bias diode 9 can be sufficiently small. That is, since the diode 9 only serves to hold the bias potential, it can be minimized as far as delay caused by the gate capacity of the MESFET 4 and interval resistance of the diode 9 is negligibly small in comparison with the delay time of the gate circuit. For instance, when gate width of the MESFET 4 is 15 μm, the size of the diode 9 may be 10 μm.

Next, the size of the coupling capacitor 8 is determined as follows. Provided that stray capacitance of the MESFET 4 and the diode 9 is $C_s$, and the capacitance of the coupling capacitor is $C_c$, a voltage $\Delta V'$ applied to the gate of the MESFET 4 when the input voltage changes by $\Delta V$ is given as:

$$\Delta V' = \{C_c/(C_s + C_c)\}\Delta V.$$

Provided that the width of the gate of the MESFET 4 and the size of the diode are the same size as that shown above, since $C_s \approx 0.04$ pF, a satisfactory results are obtainabale when $C_c = 0.05$–$0.06$ pF. When the coupling capacitory 8 is constituted by MIM type capacitor utilizing $Si_3N_4$ as insulation film, the size becomes about 20 μm × 20 μm for the insulator film of about 0.2 μm thickness.

As has been described above, according to the present embodiment, by connecting a bias diode 9 and a coupling capacitor 8 in the current source MESFET 4 of the gate circuit, the current which flows in the current source MESFET 4 can be controlled responding to the input signal. Accordingly, a gate circuit which has a high ability of driving the load with a low power consumption can be realized. Such gate circuit is especially useful in GaAs integrated circuit. Apart from the above-mentioned example, wherein the current source FET 4 is a Schottky barrier gate type FET (MESFET), this FET can be any other one as far as it is an FET. For instance, a junction gate type FET may be similarly used.

Figure 5:
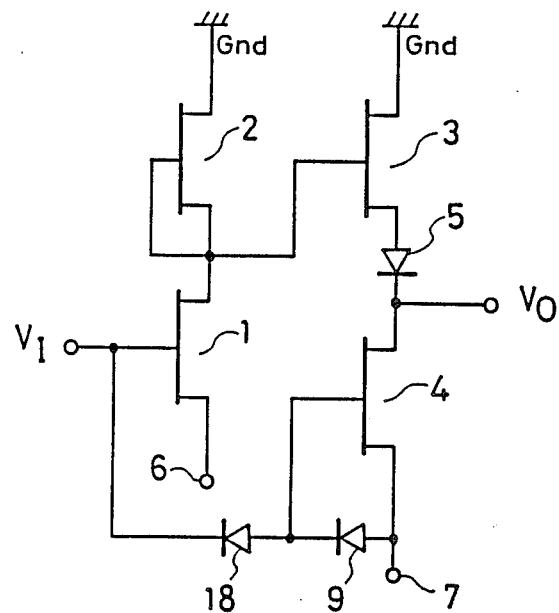
FIG. 5 is a circuit diagram of a second embodiment.

FIG. 5 shows a second embodiment of gate circuit in accordance with the present invention. The same or corresponding parts or component to those of the first example are designated by the same numerals. In this example, the feature departing from the first example is that a diode 18 is used in place of the capacitor 8 of FIG. 2. In this embodiment, junction capacitance of the diode 18 serves equivalently to the capacitance of the capacitor 8 of FIG. 2. That is, by utilizing the junction capacitance of the diode 18 as a capacitive element, a high integration is easily achievable with reasonably small number of manufacturing steps.

Figure 6:
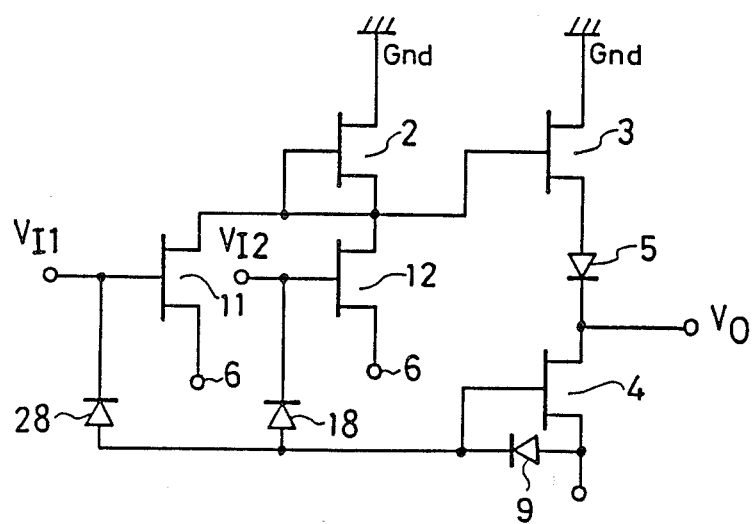
FIG. 6 is a circuit diagram of a third embodiment which is dual input NOR circuit.

FIG. 6 is a circuit diagram of a third embodiment which is a dual input NOR circuit. The same or corresponding parts or component to those of the first example are designated by the same numerals. As shown in FIG. 6, this circuit has two input terminals $V_{I1}$ and $V_{I2}$, which are connected to the gates of the switching MESFETs 11 and 12 and are further connected to the gate of the current source MESFET 4 through a diode 18 and a diode 28, respectively. The diodes 18 and 28 function as capacitances similarly to the case of the second embodiment of FIG. 5.

Apart from the dual input NOR circuit of the third embodiment, further multi-input NOR circuit can be configured in the similar way by adding combinations of input terminal and a diode.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What is claimed is:

1. A gate circuit comprising:
a first power source terminal to be supplied with a first potential,
a second power source terminal to be supplied with a second potential,
a third power source terminal to be supplied with a third potential,
a first FET connected by its gate to an input terminal and by its source to said first power source terminal,
a second FET connected by its gate and source to the drain of said first FET and by its drain to said third power source terminal,
a third FET connected by its gate to the drain of said first FET and the source and the gate of said second FET and by its drain to said third power source terminal,
a first diode connected by its one electrode to the source of said third FET,
a fourth FET connected by its drain to the other electrode of said first diode and by its source to the second power source terminal,
an output terminal connected to junction point between said other electrode of said first diode and the drain of said fourth FET,
a second diode connected by its one electrode to the source of said fourth FET and by its other electrode to the gate of said fourth FET, and
a capacitive element connected across a junction
a capacitive element connected across a junction point between the gate of said fourth FET and said other electrode of said second diode and the gate of said first FET.

2. The gate circuit in accordance with claim 1, wherein
said third power source terminal is grounded.

3. The gate circuit in accordance with claim 1, wherein
said FETs are Schottky barrier gate type FETs.

4. the gate circuit in accordance with claim 1, wherein
said FETs are junction gate type FETs.

5. The gate circuit in accordance with claim 1, wherein
said capacitive element is of metal-insulator-metal structure.

6. The gate circuit in accordance with claim 1, wherein
said capacitive element is a Schottky barrier type capacitive element.

7. The gate circuit in accordance with claim 1, wherein
said capacitive element is a junction type capacitive element.

8. The gate circuit in accordance with claim 1, wherein
said first diode and said second diode are Schottky barrier type diodes.

9. The gate circuit in accordance with claim 1, wherein
said first diode and said second diode are junction type diodes.

10. A gate circuit comprising:
a first power source terminal to be supplied with a first potential,
a second power source terminal to be supplied with a second potential,
a third power source terminal to be supplied with a third potential,
a first FET connected by its gate to an input terminal and by its source to said first power source terminal,
a second FET connected by its gate and source to the drain of said first FET and by its drain to said third power source terminal,
a third FET connected by its gate to the drain of said first FET and the source and the gate of said second FET and by its drain to said third power source terminal,
a first diode connected by its one electrode to the source of said third FET,
a fourth FET connected by its drain to the other electrode of said first diode and by its source to the second power source terminal,
an output terminal connected to junction point between said other electrode of said first diode and the drain of said fourth FET,
a second diode connected by its one electrode to the source of said fourth FET and by its other electrode to the gate of said fourth FET, and
a third diode connected across a junction point between the gate of said fourth FET and said other electrode of said second diode and the gate of said first FET.

11. The gate circuit in accordance with claim 10, wherein
said third power source terminal is grounded.

12. The gate circuit in accordance with claim 10, wherein
said FETs are Schottky barrier gate type FETs.

13. The gate circuit in accordance with claim 10, wherein
said FETs are junction gate type FETs.

14. The gate circuit in accordance with claim 10, wherein
said third diode is a Schottky barrier type diode.

15. The gate circuit in accordance with claim 10, wherein
said third diode is a junction type diode.

16. The gate circuit in accordance with claim 10, wherein
said first diode, said second diode and said third diode are Schottky barrier type diodes.

17. The gate circuit in accordance with claim 10, wherein
said first diode, said second diode and said third diode are junction type diodes.

18. A gate circuit comprising:
plural power source terminals to be supplied with respectively different potentials,
plural first FETs connected by their gates to respective ones of plural input terminals and by their sources to one of said power source terminals,
a second FET connected by its gate and source to the drain of said first FET and by its drain to said third power source terminal,
a third FET connected by its gate to the drain of said first FET and the source and the gate of said second FET and by its drain to said third power source terminal, a first diode connected by its one electrode to the source of said third FET, a fourth FET connected by its drain to the other electrode of said first diode and by its source to the second power source terminal, an output terminal connected to junction point between said other electrode of said first diode and the drain of said fourth FET, a second diode connected by its one electrode to the source of said fourth FET and by its other electrode to the gate of said fourth FET, and a capacitive element connected across a junction point between the gate of said fourth FET and said other electrode of said second diode and the gate of said first FET.

* * * * *